(12) United States Patent
Huang

(10) Patent No.: US 6,777,819 B2
(45) Date of Patent: Aug. 17, 2004

(54) SEMICONDUCTOR PACKAGE WITH FLASH-PROOF DEVICE

(75) Inventor: Chien-Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/047,498

(22) Filed: Oct. 23, 2001

(65) Prior Publication Data

US 2002/0089832 A1 Jul. 11, 2002

(30) Foreign Application Priority Data

Dec. 20, 2000 (TW) .......................................... 89127421 A

(51) Int. Cl.$^7$ .......................... H01L 23/28; H01L 23/04
(52) U.S. Cl. ...................... 257/796; 257/730; 257/704; 257/706; 257/787
(58) Field of Search ................................ 257/704–720, 257/721, 722, 730, 731, 787, 796, 659, 790, 723, 724, 783, 678–681, 687–689, 81, 82, 91, 88, 99–114

(56) References Cited

U.S. PATENT DOCUMENTS

| | | | | |
|---|---|---|---|---|
| 5,530,295 A | * | 6/1996 | Mehr | |
| 5,812,570 A | * | 9/1998 | Spaeth | |
| 6,069,027 A | * | 5/2000 | Mertol et al. | |
| 6,191,360 B1 | * | 2/2001 | Tao et al. | |
| 6,294,831 B1 | * | 9/2001 | Shishido et al. | |
| 6,392,900 B1 | * | 5/2002 | Petty et al. | |

* cited by examiner

*Primary Examiner*—Long Pham
*Assistant Examiner*—DiLinh Nguyen
(74) *Attorney, Agent, or Firm*—Peter F. Corless; Steven M. Jensen; Edwards & Angell, LLP

(57) ABSTRACT

A semiconductor package with a flash-proof device is proposed, in which at least one chip and at least one passive device mounted on a substrate are covered by a flash-proof device dimensionally designed for positioning the substrate in a conventional mold and preventing a molding resin from flashing on the substrate in a molding process, and thus quality of the fabricated package can be assured. Due to no need of a specifically designed mold, fabrication costs are reduced. Furthermore, the flash-proof device has its top side exposed to outside of an encapsulant formed in the molding process, thereby allowing heat dissipating efficiency to be improved. Moreover, the flash-proof device provides shielding for the chip and the passive device received therein, so that external electromagnetic interference with performance of the semiconductor package can be reduced.

7 Claims, 3 Drawing Sheets

US 6,777,819 B2

SEMICONDUCTOR PACKAGE WITH FLASH-PROOF DEVICE

FIELD OF THE INVENTION

The present invention relates to semiconductor packages, and more particularly, to a semiconductor package used as a multi-media card (MMC).

BACKGROUND OF THE INVENTION

Illustrated in FIG. 9 is a semiconductor package miniaturized in profile and currently used as a multi-media card (MMC) as disclosed in U.S. Pat. No. 6,040,622. In the semiconductor package 1, on a front side 100 of a substrate 10 there are mounted at least one memory chip 11 and at least one passive device 12 (only one of each is illustrated in the drawing respectively), both of which are electrically connected to the substrate 10; whereas on a back side 101 of the substrate 10 there are formed a plurality of connecting terminals 102 for electrically connecting the memory chip 11 and passive device 12 to an external device. The semiconductor package 1 further includes an encapsulant 13 for encapsulating the memory chip 11, the passive device 12 and the substrate 10 in a manner that, the back side 101 and the connecting terminals 102 of the substrate 10 are exposed to outside of the encapsulant 13 to be in direct contact with the atmosphere.

Furthermore, during a molding process, the substrate 10 having the memory chip 11 and passive device 12 is clamped between an upper mold 140 and a lower mold 141 of a mold 14, as shown in FIG. 10. Prior to molding, since the portion of the substrate 10 which is arranged to be exposed to outside of the encapsulant 13 is not clamped by the mold 14, the substrate 10 is adsorbed with vacuum onto the lower mold 141 through a via 141a formed in the lower mold 141 in a manner that, the back side 101 of the substrate 10 closely abuts the lower mold 141, so as to prevent a molding resin from flashing on the back side 101 or the connecting terminals 102 of the substrate 10 during molding.

However, several drawbacks are generated in the foregoing semiconductor package 1. First, the foregoing vacuum adsorption can not be applied to a conventional mold, and a specific mold having a vacuum adsorption function used herein is more expensive than the conventional mold, thereby making complexity and costs in fabrication both increased. Furthermore, the semiconductor package 1 encapsulates relatively more electronic and semiconductor components, and accordingly generates more heat during operation than a semiconductor package merely encapsulating a single semiconductor chip; this causes a problem of how to effectively dissipate the heat for the semiconductor package 1. In addition, as more electronic and semiconductor components are encapsulated in the semiconductor package 1, electronic performance of the semiconductor package 1 may be easily affected by external electromagnetic interference (EMI) detrimentally.

SUMMARY OF THE INVENTION

A primary objective of the present invention is to provide a semiconductor package with a flash-proof device, in which a molding resin can be effectively prevented from flashing on a back side of a substrate, and heat dissipating efficiency is significantly improved, as well as electricity and reliability of the semiconductor package can be assured.

According to the above and other objectives, the semiconductor package of the invention includes: a substrate having a first side for disposing a plurality of conductive traces thereon, and a second side for forming a plurality of electrical connection terminals thereon; at least one chip attached to the first side of the substrate and electrically connected to the substrate; at least one passive device attached to the first side of the substrate and electrically connected to the substrate; a flash-proof device attached to the first side of the substrate for forming a space for receiving the chip and the passive device therein; and an encapsulant for encapsulating the chip, the passive device, the flash-proof device and the substrate in a manner that, a top side of the flash-proof device is exposed to outside of the encapsulant; wherein a height between the top side of the flash-proof device and the first side of the substrate is slightly greater than a depth of a molding cavity of a mold used for forming the encapsulant in a molding process.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

Figure 1:
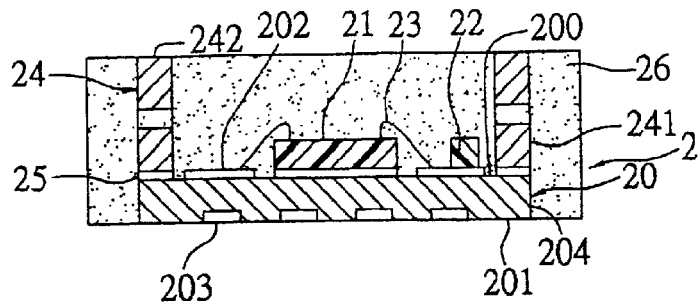
FIG. 1 is a sectional view of a semiconductor package of a first preferred embodiment of the invention.

Illustrated in FIG. 1 is a sectional view of a semiconductor package of a first preferred embodiment of the invention. The semiconductor package 2 includes a substrate 20 having a first side 200 for disposing a plurality of conductive traces 202 thereon, and a second side 201 for forming a plurality of electrical connection terminals 203 thereon, which are electrically connected to the conductive traces 202 via conductive vias or interconnecting wires (not shown). The substrate 20 can be made of polyimide resin, bismaleimide triazine (BT), epoxy resin glass (FR4) or a ceramic material, etc.

On the first side 200 of the substrate 20 there are attached a chip 21 and a passive device 22 at predetermined positions, wherein numbers of the chip 21 and passive device 22 can be optionally increased. The chip 21 is electrically connected to the conductive traces 202 on the substrate 20 via a plurality of gold wires 23; besides, the electrical connection between the chip 21 and the conductive traces 202 can also be accomplished by using a flip chip or tape automated bonding (TAB) technique. Similarly, the passive device 22 is electrically connected to the conductive traces 202 on the substrate 20 through the use of a SMT (Surface Mount Technology) techniques. As a result, the chip 21 and the passive device 22 electrically connected to the first side 200 of the substrate 20 can therefore be electrically connected to external devices through the use of the electrical connection terminals 203 on the second side 201 of the substrate 20.

Figure 2:
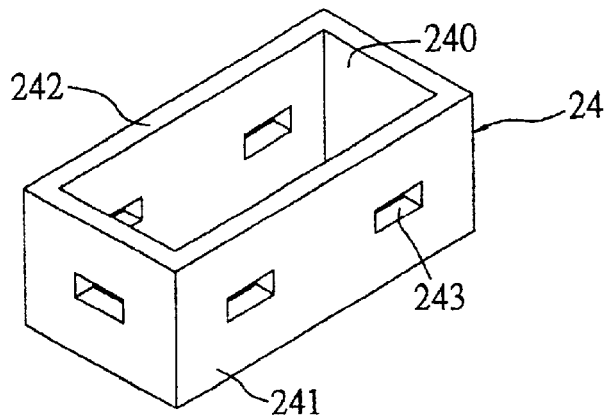
FIG. 2 is a perspective view of a flash-proof device used in a first preferred embodiment of the invention.

After the chip 21 and the passive device 22 are mounted on the substrate 20, a flash-proof device 24 is attached to a predetermined position on the first side 200 of the substrate 20 by means of a thermally conductive and elastic adhesive 25. Referring to FIG. 2, the flash-proof device 24 is a hollow rectangular frame with a cavity 240 formed therein. After attaching the flash-proof device 24 to the substrate 20, the chip 21 and the passive device 22 can be accommodated in the cavity 240 without coming into contact with the flash-proof device 24. Moreover, in order to encompass more or larger-sized chips and passive devices in the cavity 240, an outer sidewall 241 of the flash-proof device 24 is preferably aligned with a side edge 204 of the substrate 20 for maximizing surface area of the first side 200 of the substrate 20 contained in the cavity 240.

The semiconductor package 2 further includes an encapsulant 26 for encapsulating the chip 21 and the passive device 22 to be hermetically isolated from exterior, and for partially encapsulating the flash-proof device 24 and the substrate 20, wherein the second side 201 of the substrate and a top side 242 of the flash-proof device 24 are exposed to outside of the encapsulant 26. This therefore exposes the electrical connection terminals 203 on the second side 201 of the substrate 20 to be electrically connected to external devices.

Figure 3:
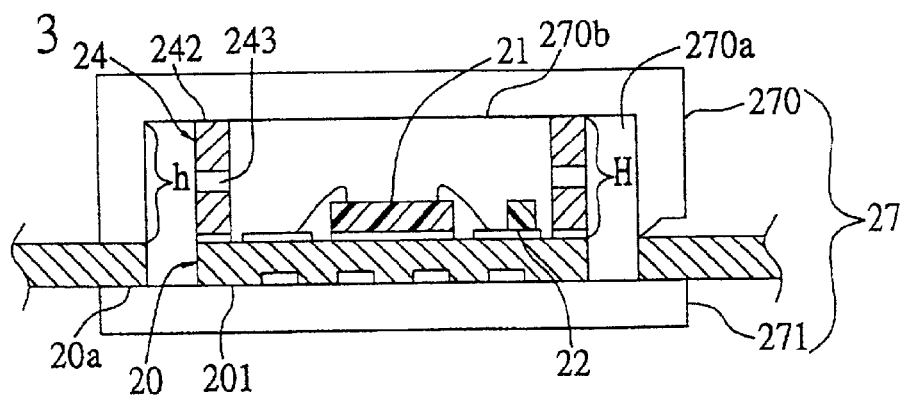
FIG. 3 is a schematic diagram of a semiconductor package of a first preferred embodiment of the invention in a molding process.

Referring to FIG. 3, the encapsulant 26 is formed by using a conventional mold 27 having an upper mold 270 and a lower mold 271. The upper mold 270 is formed with a molding cavity 270a for receiving the chip 21, the passive device 22 and the flash-proof device 24 therein. When the upper mold 270 is engaged with the lower mold 271, a peripheral portion 20a of the substrate 20 (i.e. the portion outside the molding cavity 270a) not encapsulated by the encapsulant 26 is clamped by the upper mold 270 and the lower mold 271 for positioning the substrate 20 in the molding cavity 270a. Further, as a height H from the top side 242 of the flash-proof device 24 to the first side 200 of the substrate 20 is made to be slightly greater than a depth h of the molding cavity 270a, after engaging the upper mold 270 with the lower mold 271, the top side 242 of the flash-proof device 24 closely abuts and is pressed by a top wall 270b of the molding cavity 270a. This accordingly makes the second side 201 of the substrate 20 hermetically abut the lower mold 271 without forming a gap between the substrate 20 and the lower mold 271. Therefore, during a molding process, a molding resin used for forming the encapsulant 26 can be prevented from flashing on the second side 201 of the substrate 20, which makes the semiconductor package 2 qualitatively fabricated and the electrical connection terminals 203 on the substrate 20 free of flash to be electrically connected to external devices. As a result, with the use of the flash-proof device 24, the encapsulant 26 can be formed by using the conventional mold without needing a specific mold for providing vacuum adsorption, so that costs and processes in fabrication can be reduced and simplified, respectively.

Additionally, the flash-proof device 24 is formed with a plurality of vias 243; during the molding process, the molten molding resin flows through the vias 243 into the cavity 240 of the flash-proof device 24 for encapsulating the chip 21 and the passive device 22. Moreover, the resin flowing through the vias 243 can further enhance bonding between the flash-proof device 24 and the cured encapsulant 26 after the molding process is completed.

In order to improve heat dissipating efficiency of the semiconductor package 2, the flash-proof device 24 can be made of a metallic material with good thermal conductivity, such as copper, aluminum, copper alloy, aluminum alloy or a mixture thereof. Furthermore, as the top side 242 of the flash-proof device 24 is exposed to the outside of the encapsulant 26, heat transmitted to the flash-proof device 24 can be directly dissipated to the atmosphere from the top side 242 thereof.

Second Preferred Embodiment

Figure 4:
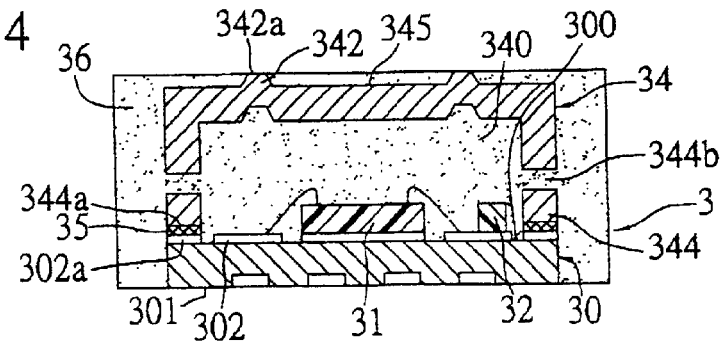
FIG. 4 is a sectional view of a semiconductor package of a second preferred embodiment of the invention.
Figure 5:
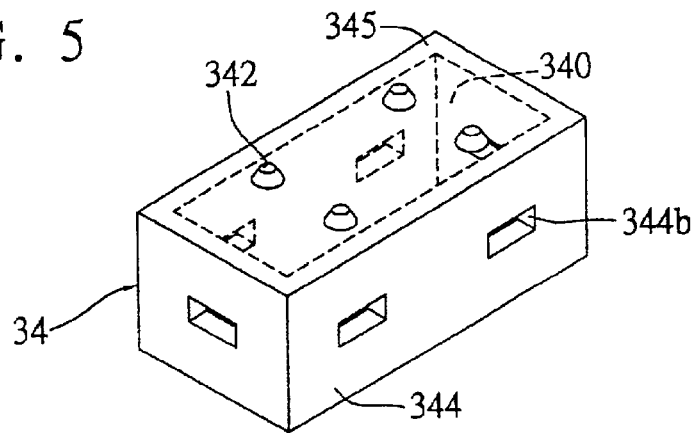

Illustrated in FIG. 4 is a sectional view of a semiconductor package of a second preferred embodiment of the invention. The semiconductor package 3 of the second embodiment differs from that of the first embodiment in that, a flash-proof device 34 of the semiconductor package 3 is a rectangular box, as shown in FIG. 5. The flash-proof device 34 has a rectangular frame 344 and a plate 345 connected to one end of the rectangular frame 344, both of which define a cavity 340 for receiving a chip 31 and a passive device 32 therein. On the plate 345 there are formed a plurality of protrusions 342 for making a height from top ends 342a of the protrusions 342 to a first side 300 of a substrate 30 slightly greater than a depth of a molding cavity of a mold (not shown) used for forming an encapsulant 36, which is used to encapsulate the chip 31, the passive device 32 and the flash-proof device 34. Thus, during a molding process, the top ends 342a of the protrusions 342 closely abut a top wall of the molding cavity of the mold for preventing a molding resin from flashing on a second side 301 of the substrate 30. Moreover, the rectangular frame 344 is formed with a plurality of vias 344b for allowing the molten molding resin to flow into the cavity 340 of the flash-proof device 34 through the vias 344b. Furthermore, at conductive traces 302 on the first side 300 of the substrate 30 there are formed ground traces 302a at positions corresponding to a bottom side 344a of the rectangular frame 344, so as to electrically connect the flash-proof device 34 to the ground traces 302a after the flash-proof device 34 is attached to the substrate 30 through an electrically conductive adhesive 35, so that electricity of the semiconductor package 3 can be increased. In addition, as the chip 31 and the passive device 32 are covered by the flash-proof device 34, influence of external electromagnetic interference (EMI) on the chip 31 during the high-frequency operation can be reduced due to a shielding effect of the flash-proof device 34, and thus the electricity of the semiconductor package 3 can be further enhanced.

Third Preferred Embodiment

Figure 6:
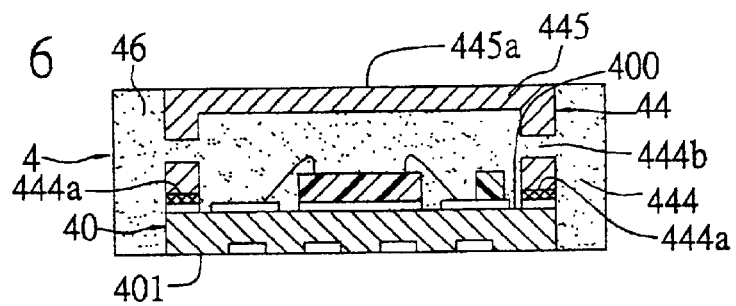
Figure 7:
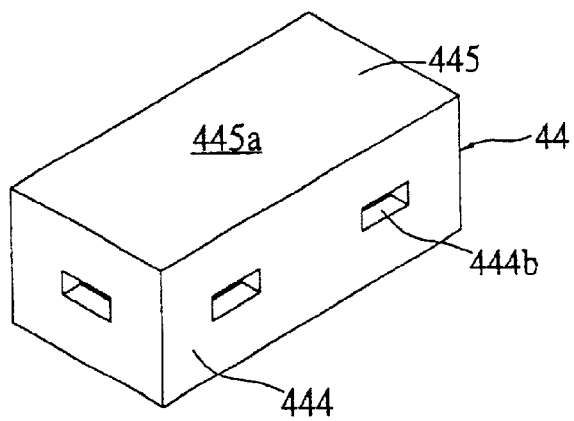
FIG. 7 is a perspective view of a flash-proof device used in a third preferred embodiment of the invention.

Illustrated in FIG. 6 is a sectional view of a semiconductor package of a third preferred embodiment of the invention. The semiconductor package 4 of the third preferred embodiment differs from that of the second preferred embodiment in that, the semiconductor package 4 is not formed with any protrusion on a plate 445 of a flash-proof device 44, as shown in FIG. 7. That is, the plate 445 has a top side 445a thereof completely exposed to outside of an encapsulant 46 for being in direct contact with the atmosphere after the encapsulant 46 is cured. Therefore, a height from the top side 445a of the plate 445 to a first side 400 of a substrate 40 needs to be slightly greater than a depth of a molding cavity of a mold (not shown) used for forming the encapsulant 46. This makes a second side 401 of the substrate 40 closely abut a lower mold (not shown) of the mold for preventing a molding resin from flashing on the second side 401 of the substrate 40. Similarly, the flash-proof device 44 is also formed with a plurality of vias 444b in a rectangular frame 444 thereof for allowing the molten molding resin to flow through the vias 444b.

Fourth Preferred Embodiment

Figure 8:
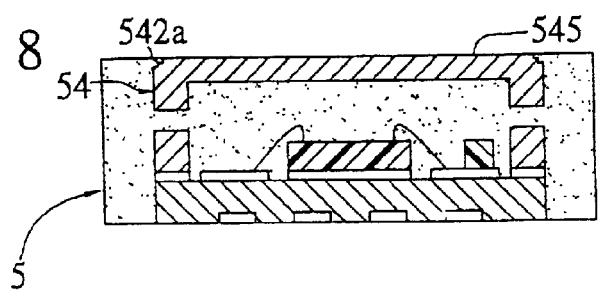
FIG. 8 is a sectional view of a semiconductor package of a fourth preferred embodiment of the invention.
Figure 9:
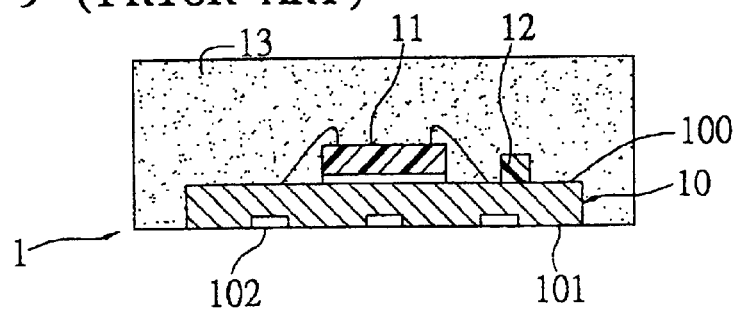
FIG. 9 (PRIOR ART) is a sectional view of a conventional MMC semiconductor package.
Figure 10:
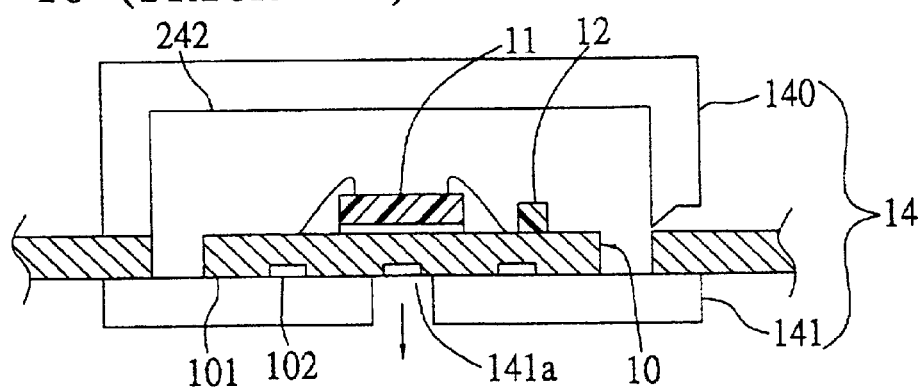
FIG. 10 (PRIOR ART) is a schematic diagram showing a conventional MMC semiconductor package in a molding process.

Illustrated in FIG. 8 is a sectional view of a semiconductor package of a fourth preferred embodiment of the invention. The semiconductor package 5 of the fourth preferred embodiment differs from that of the third preferred embodiment in that, the semiconductor package 5 is formed with step-like recesses 542a at side edges of a plate 545 of a flash-proof device 54 so as to prevent a molding resin from flashing on the plate 545.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:

a substrate having a first side for disposing a plurality of conductive traces thereon, and a second side for forming a plurality of electrical connection terminals thereon;

at least one chip attached to the first side of the substrate and electrically connected to the conductive traces;

at least one passive device attached to the first side of the substrate and electrically connected to the conductive traces;

a flash-proof device attached to the first side of the substrate and formed with a cavity for receiving the chip and the passive device therein, wherein a distance in elevation from a top side of the flash-proof device to the first side of the substrate is made to be slightly greater than a depth of a molding cavity of a mold used in a molding process, and the flash-proof device has an outer sidewall aligned with a side edge of the substrate; and an encapsulant formed by a molding compound for encapsulating the chip, the passive device, the flash-proof device and the substrate, wherein the second side of the substrate is exposed to outside of the encapsulant;

wherein by the elevation-to-depth arrangement of the flash-proof device and the molding cavity, the top side of the flash-proof device is exposed to outside of the encapsulant, and the second side of the substrate is free of flash of the molding compound.

2. The semiconductor package of claim 1, wherein the flash-proof device is attached to the substrate by an elastic adhesive.

3. The semiconductor package of claim 1, wherein the flash-proof device is attached to the substrate by a thermally conductive adhesive.

4. The semiconductor package of claim 1, wherein the flash-proof device is further formed with a plurality of vias, which allow a molding compound used for forming the encapsulant to flow therethrough.

5. The semiconductor package of claim 1, wherein a plurality of step-like recesses are formed on edges of the top side of the flash-proof device.

6. The semiconductor package of claim 1, wherein the flash-proof device has an outer sidewall thereof adjacent to a side edge of the substrate.

7. The semiconductor package of claim 1, wherein a plurality of ground traces are formed on the conductive traces at positions corresponding to the flash-proof device, for attaching the flash-proof device to the ground traces by using an electrically conductive adhesive.

* * * * *